United States Patent [19]
Uno

[11] Patent Number: 6,034,571
[45] Date of Patent: Mar. 7, 2000

[54] OSCILLATOR MODULE HAVING A MULTI-LAYERED BASE WITH A COVER

[75] Inventor: Masao Uno, Ishikawa-ken, Japan

[73] Assignee: Murata Manufacturing Co., Ltd., Nagaokakyo, Japan

[21] Appl. No.: 09/149,482

[22] Filed: Sep. 8, 1998

[30] Foreign Application Priority Data

Sep. 8, 1997 [JP] Japan .................................. 9-242906
Aug. 13, 1998 [JP] Japan ................................. 10-228834

[51] Int. Cl.[7] .............................. H03B 1/00; H05K 7/06; H05K 9/00
[52] U.S. Cl. .............................. 331/67; 331/68; 361/736; 361/741; 361/752; 361/756
[58] Field of Search ................... 331/67, 68; 361/736, 361/741, 743, 752, 756; 257/692, 731, 732, 733

[56] References Cited

U.S. PATENT DOCUMENTS

| 4,748,538 | 5/1988 | Tsuji | 361/386 |
| 5,172,077 | 12/1992 | Funada | 331/67 |
| 5,654,676 | 8/1997 | Avanic et al. | 331/67 |

FOREIGN PATENT DOCUMENTS

675621 A2   10/1995   European Pat. Off. .

OTHER PUBLICATIONS

Patent Abstracts of Japan, vol. 97, No. 10, Oct. 31, 1997, Abstract No. 9–153737.
Patent Abstracts of Japan, vol. 97, No. 4, Apr. 30, 1997, Abstract No. 8–330187.

*Primary Examiner*—Siegfried H. Grimm
*Attorney, Agent, or Firm*—Burns, Doane, Swecker & Mathis, LLP

[57] ABSTRACT

An oscillator includes a multi-layered base. Circuit patterns are formed on a first main surface and the inside of the multi-layered base. Holes through which wiring patterns of the individual layers of the base are connected are formed within the multi-layered base. Electronic components are mounted on the first main surface of the multi-layered base. First and second reverse electrodes, which serve as external terminals to be connected to an external source, are formed on a second main surface of the multi-layered base. The first reverse electrode serves as a ground electrode, and the second reverse electrodes serve as terminal electrodes. The reverse electrodes are electrically connected to the circuit patterns via the holes. The reverse electrodes are located farther inward than the lateral surfaces of the multi-layered base. A shield cover is placed to tightly cover the first main surface of the multi-layered base. It is thus possible to provide a miniaturized, less expensive, and easy-to-mount oscillator module in which unwanted radiation characteristics are improved.

4 Claims, 5 Drawing Sheets

OSCILLATOR MODULE HAVING A MULTI-LAYERED BASE WITH A COVER

BACKGROUND OF THE INVENTION

1. Field of the Invention

The present invention relates to an oscillator module, such as a voltage controlled oscillator for use in a communication apparatus, in particular, in a mobile communication apparatus.

2. Description of the Related Art

As an example of a known oscillator module, a voltage controlled oscillator is described below with reference to the drawings.

Referring to FIGS. 7 through 9, a voltage controlled oscillator 20 includes a multi-layered base 1. The multi-layered base 1 is formed by laminating a plurality of glass epoxy substrates on which circuit patterns 2 (only partially shown) are disposed, which is described later. The circuit patterns 2 are formed on one main surface (obverse surface) and the inside of the multi-layered base 1. Mounted on one main surface of the multi-layered base 1 are electronic components 3, such as a chip capacitor, a chip resistor, and a transistor. Through-holes 4 are formed on lateral surfaces of the multi-layered base 1. The through-holes 4 are used as external terminals, and through-holes electrodes 5 are formed on the surfaces of the through-holes 4.

The through-hole electrodes 5 and the circuit patterns 2 are electrically connected via through-hole forming portions disposed on one main surface or the inside of the multi-layered base 1.

Formed on the other main surface (reverse surface) of the multi-layered base 1 are, as illustrated in FIG. 9, reverse electrodes 6 and 7, both of which are electrically connected to the through-hole electrodes 5 formed on the surfaces of the through-holes 4. The reverse electrode 6 serves as a ground electrode, while the reverse electrodes 7 serve as terminal electrodes.

Referring to FIG. 8, a shield cover 8 is placed to cover one main surface of the multi-layered base 1. A voltage controlled oscillator 20 is thus formed. The shield cover 8 is provided with notches 8a so as not to contact the circuit patterns 2. A manufacturing process for the voltage controlled oscillator 20 constructed as described above is now described with reference to FIGS. 10 and 11.

A mother base 9 is first prepared by laminating and firing a plurality of ceramic green sheets provided with circuit patterns 2 (only partially shown). Through-holes 4 are then formed on split lines S that divide the mother base 9, and electronic components 3 are mounted on one main surface of the mother base 9. Through-hole electrodes 5 are formed on the inner surfaces of the through-holes 4 by means such as plating. Thereafter, the mother base 9 is diced along the split lines S with a dicer, thereby obtaining a plurality of individual bases 10 on which the electronic components 3 are mounted.

After characteristic adjustments, such as frequency adjustment, are made on each base 10, a shield cover 8 is placed, as illustrated in FIG. 11, to cover one main surface of the base 10. A voltage controlled oscillator 20 is thus formed.

The voltage controlled oscillator 20 is then placed on a mounting board 11, and the through-hole electrodes 5 are connected to wiring patterns 12 on the mounting board 11 with the use of solder 13. Thus, the voltage controlled oscillator 20 is mounted on the board 11.

However, the above known type of voltage controlled oscillator presents the following problems.

Since the through-holes 4 are used as external terminals, the area of the multi-layered base 1 is increased by an amount equal to the size of the through-holes 4, thereby enlarging the overall voltage controlled oscillator 20.

In mounting the voltage controlled oscillator 20 on the board 11, the solder 13 for connecting the voltage controlled oscillator 20 with the board 11 is formed in a fillet-like shape, thereby projecting outwardly from the bottom surface of the multi-layered base 1. Accordingly, the area where the voltage controlled oscillator 20 is mounted on the board 11 is increased.

When the voltage controlled oscillator 20 is used in a mobile communication apparatus, interference disadvantageously occurs between the voltage controlled oscillator 20 and a power amplifier within the communication apparatus. More specifically, a high output of the power amplifier interferes with the voltage controlled oscillator 20 so as to slightly modulate the frequency range used in the oscillator 20, thereby degrading sound quality of the communication apparatus. This is due to the following reason. Notches 8a are provided for the shield cover 8 to avoid an electrical connection between the shield cover 8 and the circuit patterns 2. Because of the provision of the notches 8a and the exposed through-holes 4, which serve as external terminals, the voltage controlled oscillator 20 cannot be completely shielded from an external source and is thus externally influenced by unwanted radiation.

Hitherto, the split lines S of the mother base 9 are arranged along the through-holes 4. Since the mother base 9 is split along the split lines S, burrs are generated at the end portions of the through-holes 4 of the obtained individual bases 10, or the through-hole electrodes 5 formed on the surfaces of the through-holes 4 come off. Consequently, the uniformity of the flatness of the voltage controlled oscillator 20 is impaired, thus making it difficult to mount the voltage controlled oscillator 20 on the board 11. Additionally, the through-hole electrodes 5, which serve as external terminals, come off, thereby reducing the reliability of the adhesion between the oscillator 20 and the mounting board 11.

Hitherto, various characteristics, such as frequency characteristics, are adjusted after the mother base 9 is divided into the individual bases 10. This is because of the following reason. In the mother base 9, the through-hole 4, which serves as an external electrode, is shared between adjacent bases 10. If characteristics are checked on the individual bases 10 when they are still connected, one base 10 is influenced by another base 10 whose characteristics have not yet been checked, thereby failing to correctly make characteristic adjustments. It is thus necessary to check characteristics of each base 10 after the mother base 9 is divided. However, this is very time-consuming and troublesome, thereby giving rise to an increase in the cost.

SUMMARY OF THE INVENTION

Accordingly, in order to solve the above-described problems, it is an object of the present invention to provide a miniaturized, less expensive, and easy-to-mount oscillator module in which unwanted radiation characteristics are improved.

In order to achieve the above object, according to the present invention, there is provided an oscillator module including a multi-layered base. Circuit patterns are formed on a first main surface and the inside of the multi-layered base. An electronic component is mounted on the first main surface of the multi-layered base. A shield cover is provided to cover the first main surface of the multi-layered base. An external terminal for electrically connecting the oscillator module and an external circuit is formed on a second main surface of the multi-layered base, and the external terminal is located farther inward than lateral surfaces of the multi-layered base.

In the aforementioned oscillator module, the external terminal may be formed only on the second main surface of the multi-layered base, and the shield cover may be tightly disposed on the first main surface of the multi-layered base.

In the aforementioned oscillator module, a projection may be provided on a lateral surface of the shield cover in such a manner that it faces the multi-layered base, and a guide may be formed on the multi-layered base to receive the projection.

With the above arrangement, external terminals are formed on the other surface, i.e., the reverse surface, of the multi-layered base, and the oscillator module is mounted at the reverse surface on a board by means of soldering. Accordingly, solder is not formed in a fillet-like shape on the lateral surfaces of the base, which is conventionally required.

Since the external terminals are located farther inward than the lateral surfaces of the multi-layered base, individual bases are electrically independent of each other while they are still connected to each other as the mother base, thereby making it possible to check the characteristics of the individual bases without being divided.

External terminals are not placed on the split lines of the mother base. This protects the electrodes, which serve as external terminals, from coming off and also prevents the generation of burrs when the mother base is divided.

The provision of through-holes on the lateral surface of the multi-layered base is made unnecessary, thereby reducing the area of the base by an amount equal to the through-holes.

The absence of through-holes, which serve as external terminals, on the lateral surfaces of the multi-layered base eliminates the need to provide notches for the shield cover that covers the obverse surface of the base, which is conventionally required to avoid contact between the shield cover and the through-holes. The absence of through-holes on the lateral surfaces of the multi-layered base also prevents the generation of burrs on the lateral portions, which correspond to the cross sectional surface of the mother base.

Guides are provided for the multi-layered base, thereby making it easy to position the shield cover on the multi-layered base.

DESCRIPTION OF THE PREFERRED EMBODIMENTS

A detailed description is now given with reference to the drawings of a voltage controlled oscillator, which is an example of an oscillator module, through illustration of preferred embodiments of the present invention.

Figure 1:
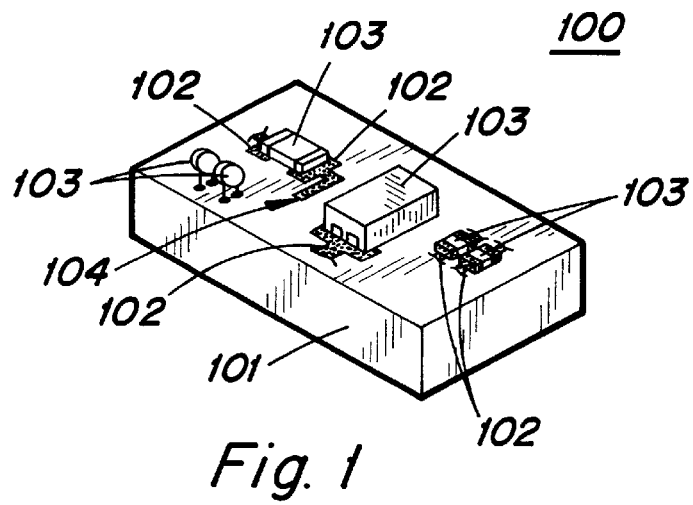
FIG. 1 is a perspective view illustrating the configuration of a voltage controlled oscillator without a shield cover being provided according to a first embodiment of the present invention.
Figure 2:
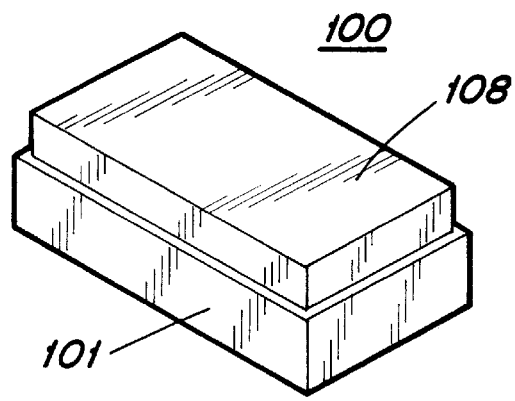
FIG. 2 is a perspective view illustrating the configuration of a voltage controlled oscillator according to the first embodiment of the present invention.
Figure 3:
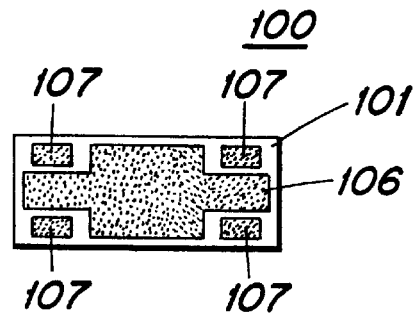
FIG. 3 is a bottom view illustrating the configuration of a voltage controlled oscillator according to the first embodiment of the present invention.

A voltage controlled oscillator according to a first embodiment of the present invention is discussed. Referring to FIGS. 1 through 3, a voltage controlled oscillator 100 includes a multi-layered base 101. The multi-layered base 101 is formed by laminating a plurality of glass epoxy substrates provided with circuit patterns 102 (only partially shown), which is described later. The circuit patterns 102 (only partially shown) are formed on one main surface (obverse surface) and the inside of the multi-layered base 101. Holes 104, such as through-holes or via-holes, through which wiring patterns 102 of the individual layers of the base 101 are connected are formed within the base 101.

Electronic components 103, such as a chip capacitor, a chip resistor, and a transistor, are mounted on one main surface of the multi-layered base 101.

Reverse electrodes 106 and 107, which are used as external terminals to be connected to an external circuit (not shown), are disposed, as illustrated in FIG. 3, on the other main surface (reverse surface) of the multi-layered base 101 by means such as gold-flashing or gold-plating. The reverse electrode 106 serves as a ground electrode, while the reverse electrodes 107 serve as terminal electrodes. The reverse electrodes 106 and 107 are electrically connected to the circuit patterns 102 via the holes 104, such as the through-holes or the via-holes, formed within the multi-layered base 101. The reverse electrodes 106 and 107 are located farther inward than the lateral surfaces of the multi-layered base 101.

A shield cover 108 is placed to cover one main surface of the multi-layered base 101. The shield cover 108 is fixed on the base 101 by soldering it to connecting electrodes (not shown) provided on the surface of the multi-layered base 101, though it is not shown. In this manner, the voltage controlled oscillator 100 is formed.

The manufacturing process of the voltage controlled oscillator 100 constructed as described above is now described with reference to FIGS. 4 and 5.

A mother base 109 is prepared by laminating a plurality of glass epoxy substrates provided with the circuit patterns 102 (only partially shown). Then, electronic components 103 are mounted on one main surface of the mother base 109, and the reverse electrodes 106 and 107 are formed on the other surface to the mother base 109 by means of gold-flashing. Characteristic adjustments, such as frequency adjustments, are made on the individual bases 110 while they are still connected to each other as the mother base 109, which is described in detail later. Subsequently, the shield cover 108 is placed to cover one main surface of the bases 110.

Figure 4:
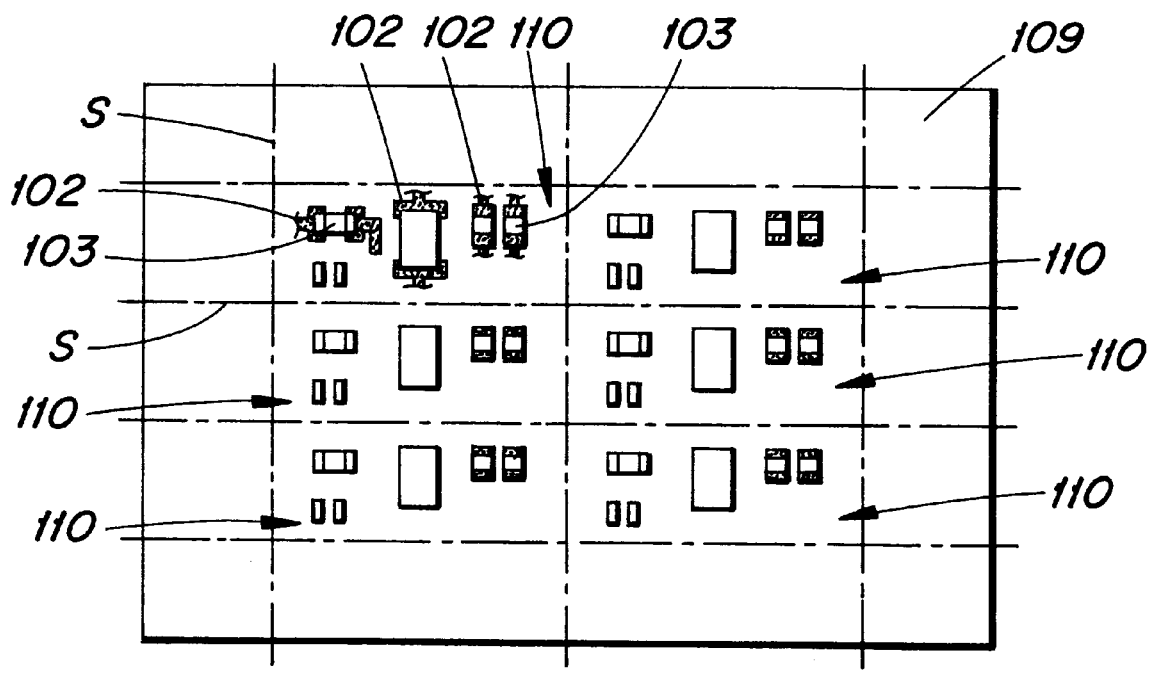
FIG. 4 is a plan view of a mother base illustrating a manufacturing process of the voltage controlled oscillator according to the first embodiment of the present invention.
Figure 5:
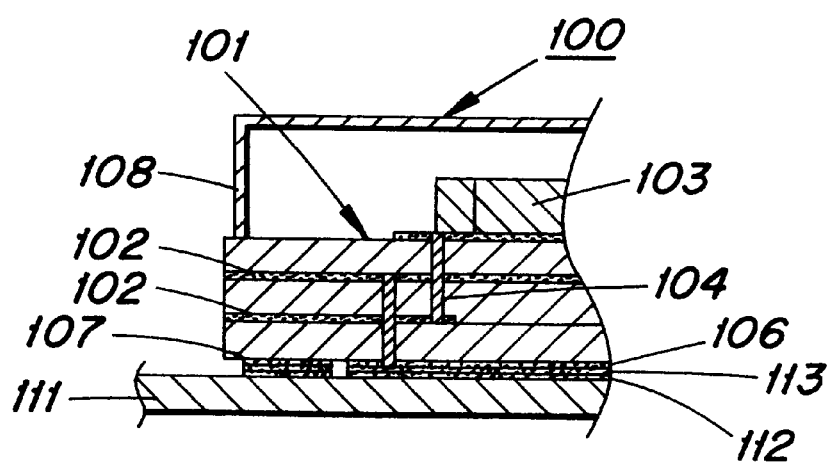
FIG. 5 is a sectional view, partially shown, illustrating the configuration of the voltage controlled oscillator mounted on a board according to the first embodiment of the present invention.

Thereafter, the mother base 109 is divided with, for example, a dicer along split lines S indicated by the one-dot-chain lines shown in FIG. 4. Thus, a plurality of voltage controlled oscillators 100 are formed, each having a base 110 on which the electronic components 103 are mounted and on which the shield cover 108 is placed.

In the aforementioned manufacturing process, frequency adjustments are made after the electronic components 103 are mounted. However, frequency adjustments may be made after the electronic components 103 are mounted and the shield cover 108 is placed to cover the mother base 109. The mother base 109 may be then divided to obtain a plurality of voltage controlled oscillators 100. The electronic components 103 and the shield cover 108 may be mounted simultaneously by means of reflow soldering.

The voltage controlled oscillator 100 manufactured according to the above process is mounted on a mounting board 111 in the following manner.

A solder paste 113 is first applied to the portion of a wiring pattern 112 formed on the mounting board 111 to which the external terminals of the voltage controlled oscillator 100 are bonded. The voltage controlled oscillator 100 is then placed on the mounting board 111 in such a manner that the reverse electrodes 106 and 107, which serve as the external terminals, are aligned with the portion of the wiring pattern 112 coated with the solder paste 113.

The voltage controlled oscillator 100 placed on the board 111 is then loaded into a reflow apparatus (not shown), thereby melting the solder paste 113 and securely connecting the oscillator 100 and the board 111. In this manner, the voltage controlled oscillator 100 is mounted on the board 111.

According to the voltage controlled oscillator 100 constructed as described above, since the reverse electrodes 106 and 107, which serve as the external terminals, are formed farther inward than the lateral surfaces of the reverse main surface of the multi-layered base 101, they are not exposed on the lateral surfaces of the base 101. In mounting the voltage controlled oscillator 100 on the board 111, the oscillator 100 is mounted at the reverse surface on the board 111 by means of reflow soldering. Thus, it is not necessary to form solder in a fillet-like shape, thereby decreasing the area where the voltage controlled oscillator 100 is mounted.

Since the provision of through-holes on the lateral surfaces of the multi-layered base 101 is made unnecessary, the area of the multi-layered base 101 can be decreased by an amount equal to the through-holes, thereby achieving a miniaturized voltage controlled oscillator 100.

The absence of through-holes, which serve as external terminals, on the lateral surfaces of the multi-layered base 101 eliminates the need to provide notches for the shield cover 108 that covers one main surface of the multi-layered base 101, which would otherwise be required for avoiding contact between the shield cover 108 and the through-holes. The shield cover 108 can thus tightly contact one main surface of the multi-layered base 101. As a consequence, the voltage controlled oscillator 100 of the present invention is less influenced by unwanted radiation from an external source, thereby obtaining stable characteristics.

The absence of through-holes on the lateral surface of the multi-layered base 101 also prevents the generation of burrs on the lateral portions, i.e., the cross sectional surface of the mother base 109. This makes it possible to correctly position and stably mount the voltage controlled oscillator 100 on the board 111. Since the reverse electrodes 106 and 107 are also free from burrs, they do not come off.

Through-holes, which serve as external terminals, are not formed on the lateral surfaces of the multi-layered base 101, and only the reverse surface of the base 101 is provided with the reverse electrodes 106 and 107. Accordingly, in the process step of forming the multi-layered base 101, the individual bases 110 are already electrically independent of each other while they are still connected to each other as the mother base 109. This makes it possible to check and adjust the characteristics of the individual bases 110 as voltage control oscillators 100 before the mother base 109 is divided. Thus, merely by moving a probe used for checking characteristics on the mother base 109, the characteristics of a plurality of bases 110 are checked and adjusted, thereby saving time and effort and also achieving a reduction in the cost.

Figure 6:
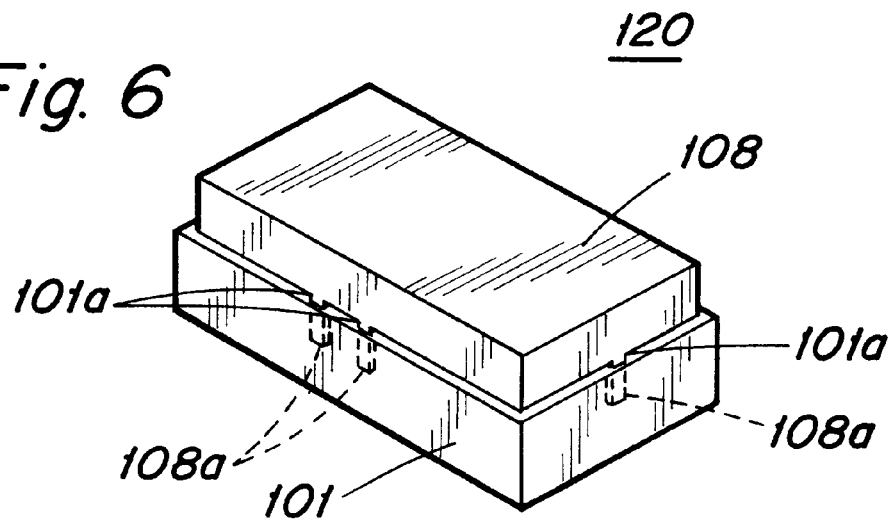
FIG. 6 is a perspective view illustrating the configuration of a voltage controlled oscillator according to a second embodiment of the present invention.
Figure 7:
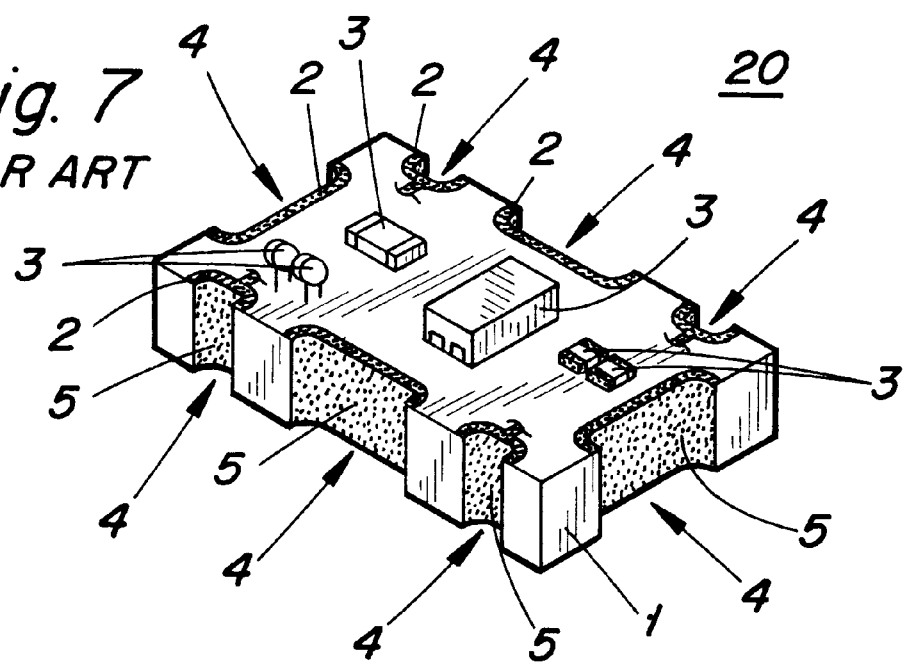
FIG. 7 is a perspective view illustrating the configuration of a known voltage controlled oscillator without a shield cover being provided.
Figure 8:
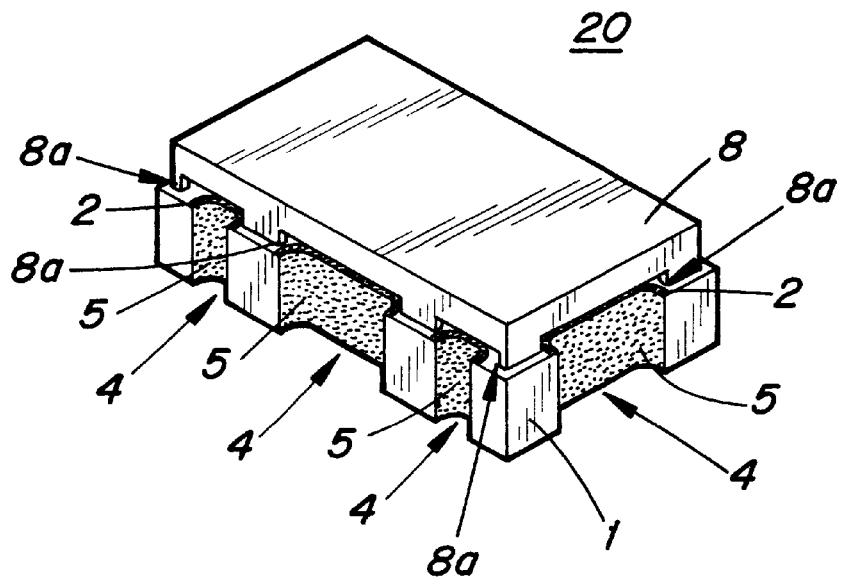
FIG. 8 is a perspective view illustrating the configuration of a known voltage controlled oscillator.
Figure 9:
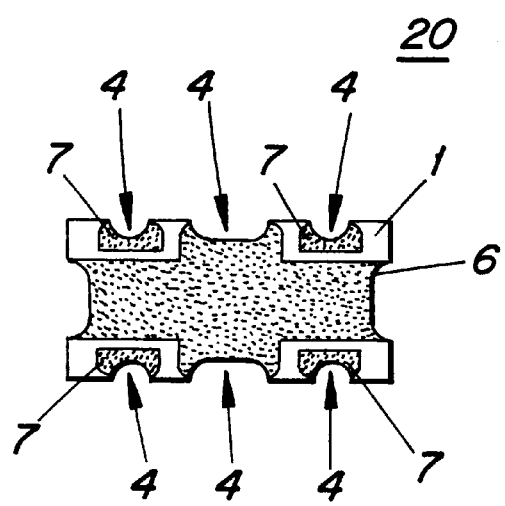
FIG. 9 is a bottom view illustrating the configuration of a known voltage controlled oscillator.
Figure 10:
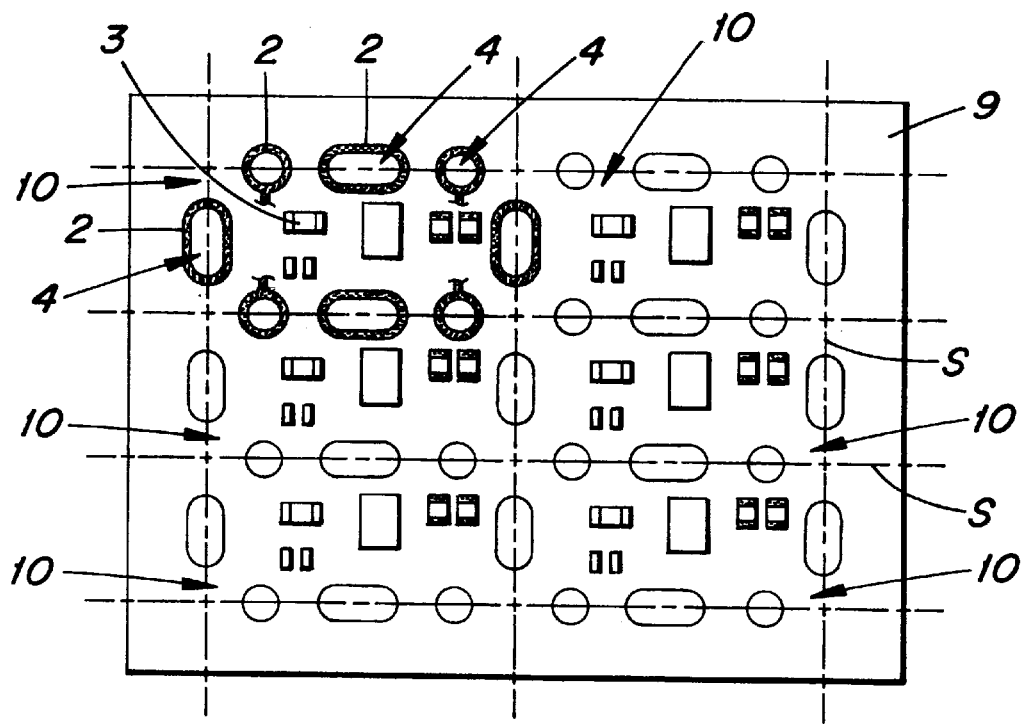
FIG. 10 is a plan view of a mother base illustrating a manufacturing process of a known voltage controlled oscillator.
Figure 11:
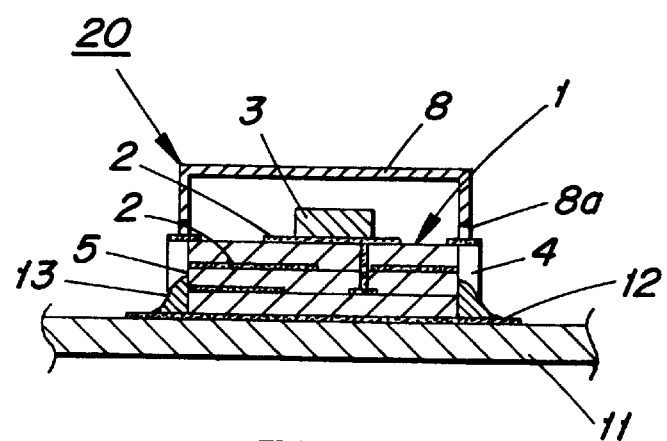
FIG. 11 is a sectional view illustrating the configuration of a known voltage controlled oscillator mounted on a board.

A voltage controlled oscillator, which is an example of an oscillator module, according to a second embodiment of the present invention is now described with reference to FIG. 6. The same elements as those shown in FIG. 2 representing the first embodiment are designated with like reference numerals, and an explanation thereof is thus omitted.

In the voltage controlled oscillator 120 of this embodiment, projections 108*a* extend downward from the lateral surfaces of the shield cover 108 to face the multi-layered base 101. Guide holes 101*a* are formed as guides on the multi-layered base 101 to receive the projections 108*a*.

With this arrangement, the shield cover 108 can be easily positioned on the individual bases 110 in the state of the mother base 109, and the shield cover 108 can also be stably secured to the bases 110 by means of reflow soldering without moving.

The guide holes 110*a* may pass through or may not pass through the multi-layered base 101, and it is only essential that the guide holes 101*a* are sized sufficiently to receive the projections 108*a*. The guides are not restricted to holes, and may be elongated grooves, in which case, the projections 108*a* are also required to be formed to match the configurations of the guides. The guides are not necessarily positioned on the obverse surface of the multi-layered base 101, and may be formed on the portions including the lateral surfaces of the base 101 in a shape having a semi-circular cross section.

Although in the first and second embodiments a multi-layered base formed of glass epoxy substrates is used, a multi-layered base formed by laminating a plurality of ceramic green sheets may be used.

A solder resist may be provided on the reverse electrodes 106 and 107 at a portion other than the area where the electrodes 106 and 107 are soldered, though it is not shown. This structure makes it possible to prevent solder from excessively flowing when the reverse electrodes 106 and 107 are soldered to the mounting board 111 by reflow soldering, which would otherwise cause a short-circuit between the reverse electrodes 106 and 107.

In the foregoing embodiments, a voltage controlled oscillator is described as an example of the oscillator module of the present invention. The present invention is, however, applicable to other types of oscillator modules.

The provision of guides for the multi-layered base 101 makes it easy to position the shield cover 108 on the surface of the base 101.

As is seen from the foregoing description, the oscillator module of the present invention offers the following advantages.

Since it is not necessary to form solder in a fillet-like shape on the lateral surfaces of a multi-layered base, the area where the oscillator module is mounted on a board is reduced, thereby miniaturizing the oscillator module.

External terminals disposed on the reverse surface of the multi-layered base are located farther inward than the lateral surfaces of the base. Accordingly, in the process step of forming a multi-layered base for use in an oscillator module, the individual bases are electrically independent of each other while they are still connected to each other as the mother base, and thus, characteristics of each base as an oscillator module can be checked and adjusted. Merely by moving a probe used for checking characteristics on the mother base, a plurality of individual bases can be checked and adjusted, thereby saving time and effort and also achieving a reduction in the cost.

By virtue of the absence of through-holes, the area of the multi-layered base can be reduced by an amount equal to the through-holes, thereby miniature the oscillator module.

Since the shield cover tightly covers one main surface of the multi-layered base, the oscillator module is less affected by unwanted radiation from an external source, thereby obtaining stable characteristics. The external terminals are not exposed on the lateral surfaces of the multi-layered base, thereby also reducing an influence of unwanted radiation.

The absence of burrs makes it possible to correctly position and stably mount the oscillator module on a board. The external terminals are also free from burrs and do not come off, thereby improving the reliability of adhesion between the oscillator module and a mounting board.

What is claimed is:

1. An oscillator module comprising:

a multi-layered base;

circuit patterns formed on a first main surface and the inside of said multi-layered base;

an electronic component mounted on said first main surface of said multi-layered base; and a shield cover provided to cover said first main surface of said multi-layered base, wherein an external terminal for electrically connecting said oscillator module to an external circuit is formed on a second main surface of said multi-layered base, and said external terminal is located farther inward than lateral surfaces of said multi-layered base.

2. An oscillator module according to claim 1, wherein said external terminal is formed only on said second main surface of said multi-layered base, and said shield cover is tightly disposed on said first main surface of said multi-layered base.

3. An oscillator module according to claim 1, wherein a projection is provided on a lateral surface of said shield cover in such a manner that it faces said multi-layered base, and a guide is formed on said multi-layered base to receive said projection.

4. An oscillator module according to claim 2, wherein a projection is provided on a lateral surface of said shield cover in such a manner that it faces said multi-layered base, and a guide is formed on said multi-layered base to receive said projection.

* * * * *